(12) United States Patent
Lin et al.

(10) Patent No.: US 7,713,797 B2
(45) Date of Patent: May 11, 2010

(54) PIXEL STRUCTURE AND MANUFACTURING METHOD THEREOF

(75) Inventors: Hsiang-Lin Lin, Hsinchu (TW); Chun-Chieh Tsao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/177,882

(22) Filed: Jul. 23, 2008

(65) Prior Publication Data
US 2009/0166634 A1  Jul. 2, 2009

(30) Foreign Application Priority Data
Dec. 27, 2007  (TW) .............................. 96150582 A

(51) Int. Cl.
*H01L 21/00* (2006.01)
*H01L 21/84* (2006.01)

(52) U.S. Cl. ................. 438/149; 438/151; 257/E21.32; 257/E21.561

(58) Field of Classification Search ................. 438/149, 438/151, 155, 157, 283; 257/E21.32, E21.561, 257/E21.7, E21.704
See application file for complete search history.

(56) References Cited

U.S. PATENT DOCUMENTS 6,218,221 B1 * 4/2001 Sah ............................ 438/158
6,667,241 B2 12/2003 Lai
2005/0264729 A1 12/2005 Lin et al.

FOREIGN PATENT DOCUMENTS

| CN | 1976046 | 6/2007 |
| CN | 101030587 | 9/2007 |
| JP | 2005055808 | 3/2005 |
| TW | I253108 | 4/2006 |

OTHER PUBLICATIONS

"1st Office Action of China counterpart application", issued on Sep. 18, 2009, p. 1-p. 3.

* cited by examiner

*Primary Examiner*—Hoai V Pham
(74) *Attorney, Agent, or Firm*—Jianq Chyun IP Office

(57) ABSTRACT

A pixel structure including a gate, a gate dielectric layer, a patterned semiconductor layer having a channel area disposed above the gate, a patterned dielectric layer having an etching-stop layer disposed above the gate and a number of bumps, a patterned metal layer having a reflective pixel electrode, a source and a drain, an overcoat dielectric layer, and a transparent pixel electrode sequentially disposed on a substrate is provided. The source and the drain respectively cover portions of the channel area. The reflective pixel electrode connects the drain and covers the bumps to form an uneven surface. The overcoat dielectric layer disposed on a transistor constituted by the gate, the gate dielectric layer, the patterned semiconductor layer, the source and the drain has a contact opening exposing a portion of the reflective pixel electrode. The transparent pixel electrode is electrically connected to the reflective pixel electrode through the contact opening.

7 Claims, 9 Drawing Sheets

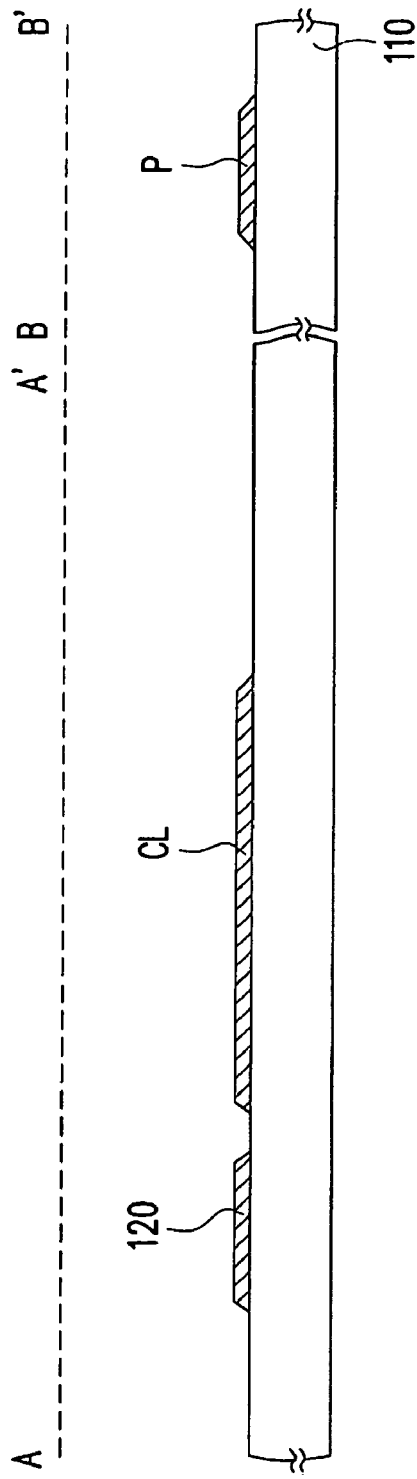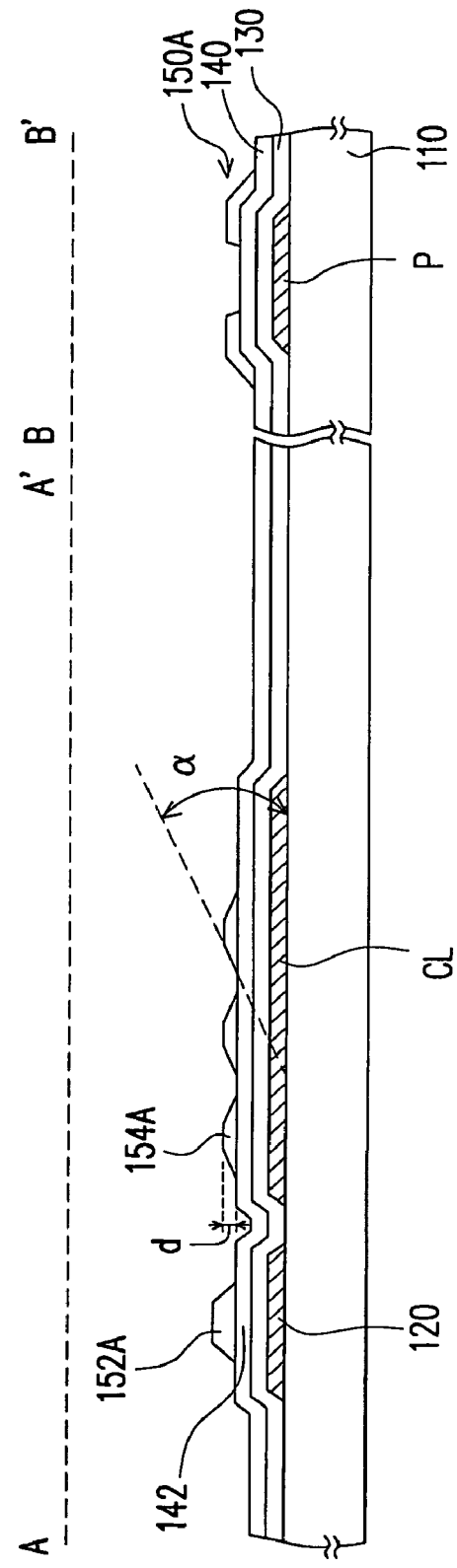

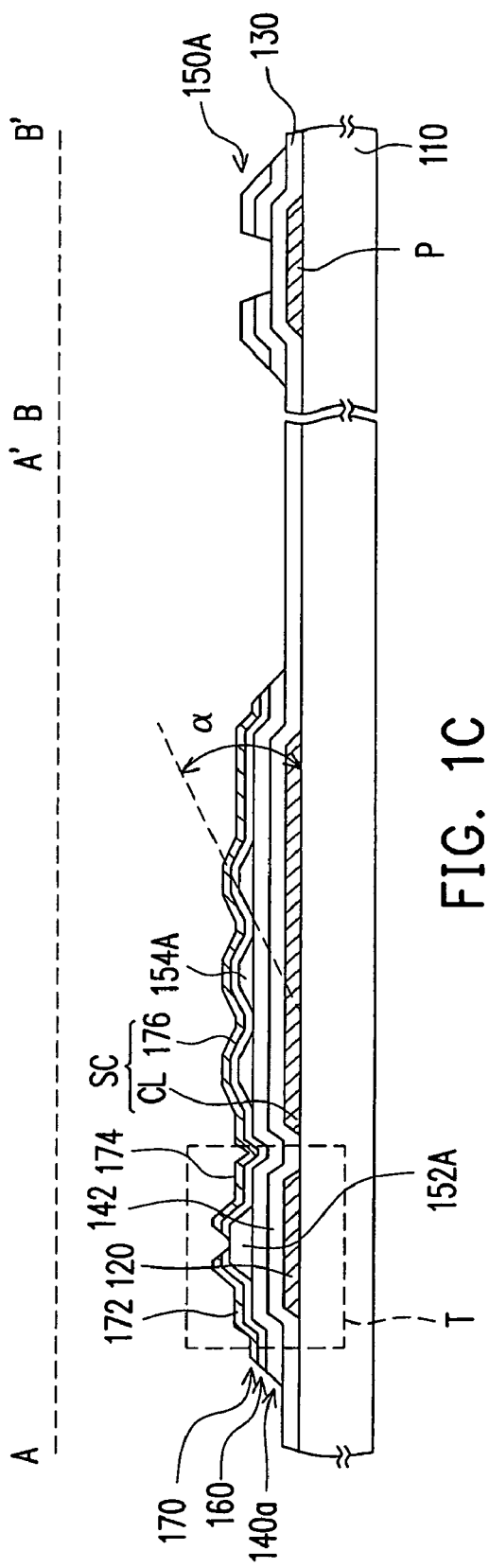
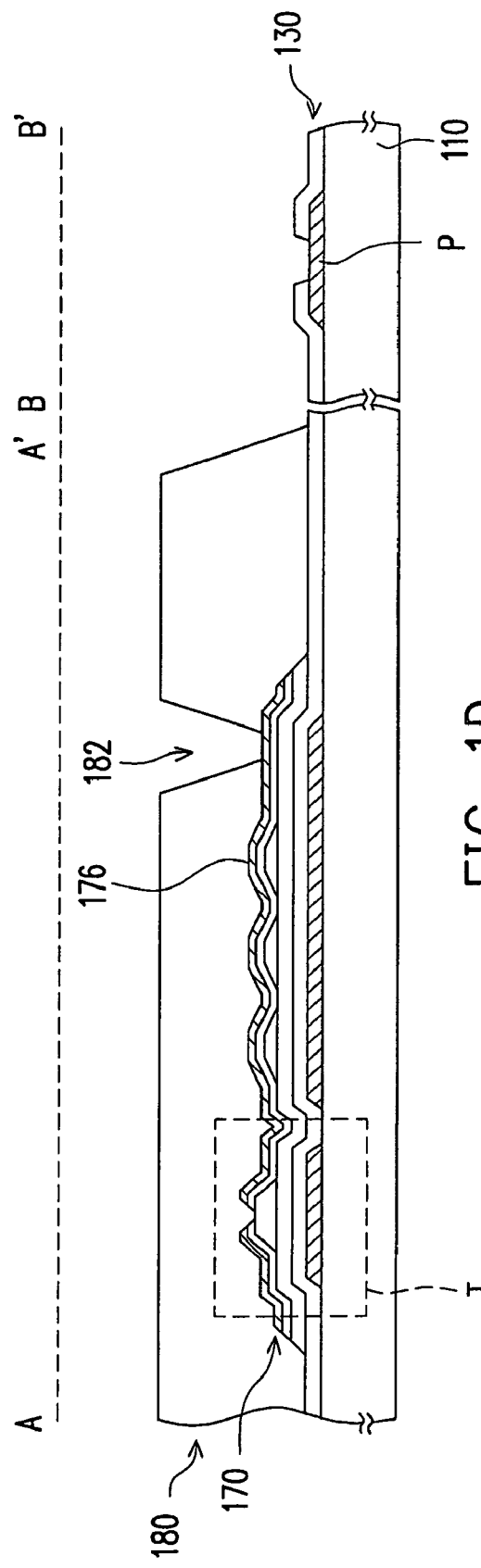

PIXEL STRUCTURE AND MANUFACTURING METHOD THEREOF

CROSS-REFERENCE TO RELATED APPLICATION

This application claims the priority benefit of Taiwan application serial no. 96150582, filed on Dec. 27, 2007. The entirety of the above-mentioned patent application is hereby incorporated by reference herein and made a part of specification.

BACKGROUND OF THE INVENTION

1. Field of the Invention

The present invention relates to a pixel structure and a manufacturing method thereof. More particularly, the present invention relates to a pixel structure having a reflective pixel electrode and a manufacturing method thereof.

2. Description of Related Art

With the popularization of liquid crystal displays (LCDs), a number of portable electronic devices, such as mobile phones, personal digital assistants (PDAs), or pocket PCs by degrees require outstanding display performance of the LCDs. The portable electronic devices not only necessitate satisfactory display performance indoors, but also require appropriate frame qualities outdoors or in a high luminance environment.

Thus, how to maintain a sharp display quality in the high luminance environment has become one of the major trends in LCD development. In view of the foregoing, a transflective LCD (TR-LCD) has been developed according to the related art. The TR-LCD is able to achieve desirable display effects both indoors and in a bright outdoor environment.

In a conventional TR-LCD, a pixel structure is equipped with a reflective pixel electrode suitable for reflecting external light, such that a reflective area is formed. To ensure that the display effect in the reflective area is as favorable as the display effect in a transmissive area where no reflective pixel electrode is disposed, a padding layer is frequently inserted under the reflective pixel electrode. Thereby, the TR-LCD having dual cell gap can be constructed. In addition, a plurality of photoresist bumps is often disposed under the reflective pixel electrode in the conventional pixel structure, so as to improve the reflectivity of the reflective pixel electrode. However, the padding layer, the reflective pixel electrode on the padding layer, and the photoresist bumps are fabricated through a rather complicated process and require more manufacturing costs. Based on the above, it is rather difficult to simplify the process of manufacturing the pixel structure of the TR-LCD while a reduced cost and a desirable quality of the pixel structure are needed to be guaranteed.

SUMMARY OF THE INVENTION

The present invention is directed to a pixel structure capable of implementing a single cell gap process to fabricate a TR-LCD.

The present invention is further directed to a manufacturing method of a pixel structure for fabricating the pixel structure with higher reflectivity and better quality through performing a simplified manufacturing process.

The present invention provides a pixel structure suitable for being disposed on a substrate. The pixel structure includes a gate, a gate dielectric layer, a patterned semiconductor layer, a patterned dielectric layer, a patterned metal layer, an overcoat dielectric layer, and a transparent pixel electrode. The gate is disposed on the substrate on which the patterned dielectric layer is disposed to cover the gate. The patterned semiconductor layer is disposed on the gate dielectric layer and has a channel area located above the gate. The patterned dielectric layer is disposed on the patterned semiconductor layer and has an etching-stop layer disposed above the gate and a plurality of bumps. The patterned metal layer includes a source, a drain and a reflective pixel electrode connected to the drain. The source and the drain respectively cover portions of the channel area, while the reflective pixel electrode covers the bumps to form an uneven surface. The gate, the gate dielectric layer, the patterned semiconductor layer, the source, and the drain together form a transistor. The overcoat dielectric layer is disposed on the transistor and includes a contact opening to expose a portion of the reflective pixel electrode. The transparent pixel electrode is disposed on the overcoat dielectric layer and is electrically connected to the reflective pixel electrode through the contact opening.

According to an embodiment of the present invention, the pixel structure further includes an ohmic contact layer sandwiched between the patterned metal layer and the patterned semiconductor layer and between the patterned metal layer and the patterned dielectric layer.

According to an embodiment of the present invention, the ohmic contact layer and the patterned metal layer have identical patterns.

According to an embodiment of the present invention, a dielectric constant of the overcoat dielectric layer approximately ranges from 2 to 7.

According to an embodiment of the present invention, a thickness of the overcoat dielectric layer approximately ranges from 0.1 μm to 6 μm.

According to an embodiment of the present invention, a thickness of the bumps approximately ranges from 0.1 μm to 3 μm.

According to an embodiment of the present invention, the pixel structure further includes a common electrode line disposed on the substrate. The common electrode line and a portion of the reflective pixel electrode disposed above the common electrode line together form a storage capacitor.

According to an embodiment of the present invention, the bumps include organic bumps or inorganic bumps.

The present invention further provides a manufacturing method of a pixel structure. The manufacturing method includes following steps. First, a substrate is provided, and a gate is formed on the substrate. Next, a gate dielectric layer is formed on the substrate and covers the gate. Thereafter, a semiconductor layer is formed on the gate dielectric layer and has a channel area located above the gate. A patterned dielectric layer is then formed on the semiconductor layer and includes an etching-stop layer disposed above the gate and a plurality of bumps. After that, a patterned metal layer is formed over the substrate and includes a source, a drain and a reflective pixel electrode connected to the drain. The source and the drain respectively cover portions of the channel area. The reflective pixel electrode covers the bumps to form an uneven surface. Next, the semiconductor layer is patterned with use of the patterned metal layer as a mask, so as to form a patterned semiconductor layer. Here, the gate, the gate dielectric layer, the patterned semiconductor layer, the source and the drain together form a transistor. Afterwards, an overcoat dielectric layer is formed on the transistor, and a contact opening is formed on the overcoat dielectric layer to expose a portion of the reflective pixel electrode. Thereafter, a transparent pixel electrode is formed on the overcoat dielectric layer and is electrically connected to the reflective pixel electrode through the contact opening.

According to another embodiment of the present invention, the manufacturing method further includes forming an ohmic contact layer sandwiched between the patterned metal layer and the patterned semiconductor layer and between the patterned metal layer and the patterned dielectric layer.

According to another embodiment of the present invention, the ohmic contact layer and the patterned metal layer are patterned simultaneously.

According to another embodiment of the present invention, a dielectric constant of the overcoat dielectric layer approximately ranges from 2 to 7.

According to another embodiment of the present invention, a thickness of the overcoat dielectric layer approximately ranges from 0.1 μm to 6 μm.

According to another embodiment of the present invention, a thickness of the bumps approximately ranges from 0.1 μm to 3 μm.

According to another embodiment of the present invention, a common electrode line is further formed on the substrate when the gate is formed. Here, the common electrode line and a portion of the reflective pixel electrode disposed above the common electrode line together form a storage capacitor.

In the manufacturing method of the pixel structure according to the present invention, the plurality of bumps is formed during the formation of the etching-stop layer. Meanwhile, the reflective pixel electrode covers the bumps. Through adjusting angles and the thickness of the bumps, the reflectivity of the reflective pixel electrode can be promoted. Moreover, in the pixel structure of the present invention, the overcoat dielectric layer covers the reflective pixel electrode, so as to adjust an electrical field above the reflective pixel electrode. Thereby, the TR-LCD having said pixel structure is capable of achieving identical display performance both in a transmissive mode and in a reflective mode.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1E are top views depicting a manufacturing method of a pixel structure according to an embodiment of the present invention.

DESCRIPTION OF EMBODIMENTS

Generally, a reflective pixel electrode disposed in a pixel structure enables the pixel structure to reflect lights. Given that a transparent pixel electrode is simultaneously disposed outside the reflective pixel electrode in the pixel structure, the pixel structure is able to display both in a transmissive mode and in a reflective mode. According to the related art, it can be deduced that a padding layer inserted under the reflective pixel electrode and photoresist bumps for increasing the reflectivity of the pixel structure are often fabricated in the pixel structure to ensure the display quality thereof. However, said process complicates the fabrication of the pixel structure, leading to a reduction in production and yield of the products. Accordingly, the present invention provides a manufacturing method of a pixel structure for fabricating the pixel structure with great quality in a simplified manufacturing process.

Figure 1E:
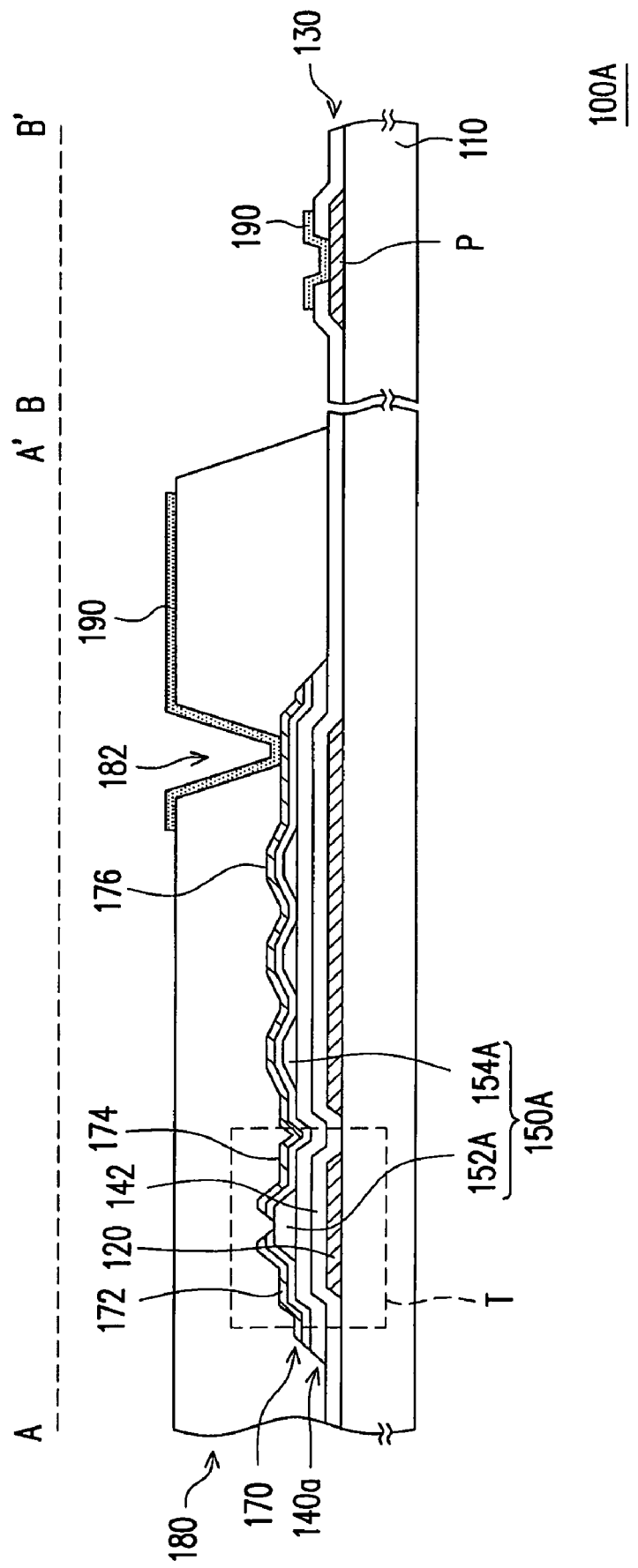
Figure 2A:
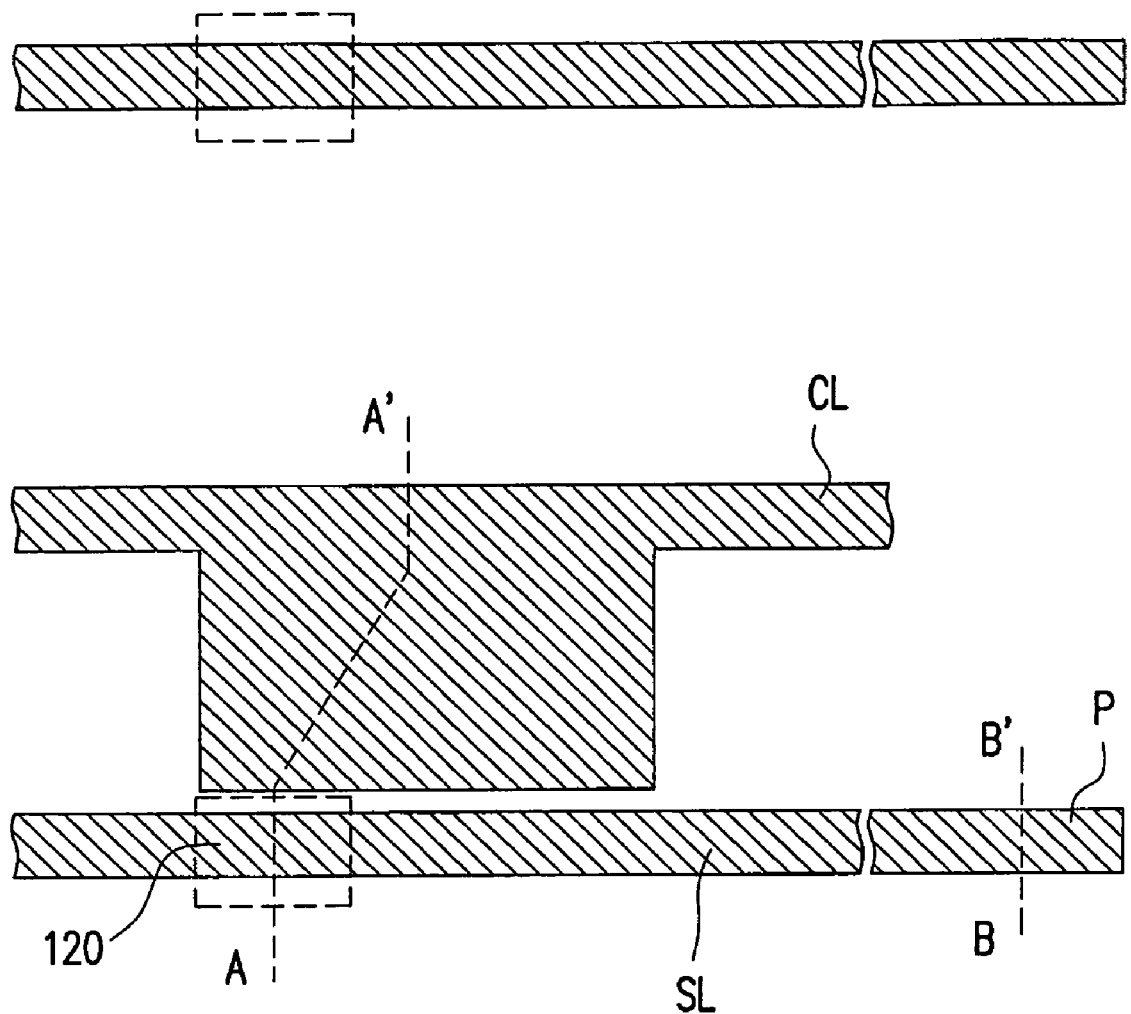
FIGS. 2A through 2E are cross-sectional views along lines A-A' and B-B' of FIGS. 1A through 1E.

FIGS. 1A through 1E are top views depicting a manufacturing method of a pixel structure according to an embodiment of the present invention. FIGS. 2A through 2E are cross-sectional views along lines A-A' and B-B' of FIGS. 1A through 1E. Referring to FIGS. 1A and 2A together, a substrate 110 is provided and a gate 120 is formed thereon. A method of forming the gate 120 includes, for example, forming a gate material layer (not shown) on the substrate 110 through performing a sputtering process and then patterning the gate material layer through implementing an etching process with use of a patterned photoresist as a mask, such that the gate 120 is formed. In the step of patterning the gate material layer, a common electrode line CL, a scan line SL connected to the gate 120, and a bonding pad P for drivers can be together formed on the substrate 110.

The substrate 110 may be a transparent substrate such as a glass substrate, a plastic substrate, and so forth, and the material of the gate material layer may be either any conductive material applied to fabricate the gate 120 in the related technical field or a combination of various conductive materials. For example, the material of the gate material layer can be aluminum (Al), copper (Cu), molybdenum (Mo), silver (Ag), gold (Au), an alloy consisting of said metals, or a composite metal layer consisting of said metals.

Figure 2B:
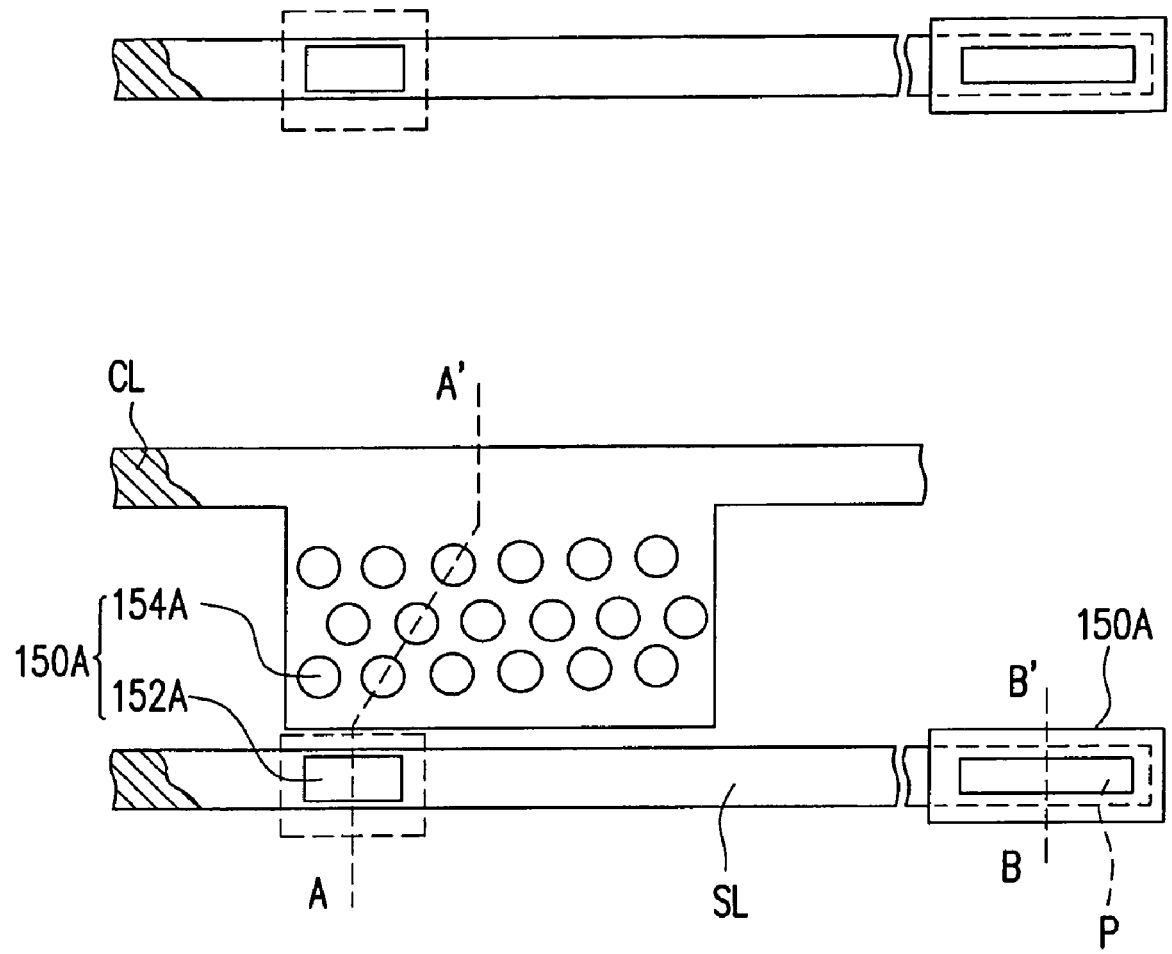

Next, referring to FIGS. 1B and 2B together, a gate dielectric layer 130 and a semiconductor layer 140 are sequentially formed on the substrate 110. Here, the gate dielectric layer 130 covers the gate 120, the common electrode line CL, the scan line SL and the bonding pad P, while and the semiconductor layer 140 covers the gate dielectric layer 130 and includes a channel area 142 located above the gate 120. Thereafter, a patterned dielectric layer 150A is formed on the semiconductor layer 140 and includes an etching-stop layer 152A located above the channel area 142 and a plurality of bumps 154A disposed above the common electrode line CL. The patterned dielectric layer 150A can also cover a portion of the semiconductor layer 140 disposed above the bonding pad P.

Particularly, a method of forming the patterned dielectric layer 130 and the semiconductor layer 140 includes following steps. First, the gate dielectric layer 130 is formed on the substrate 110 through implementing a deposition process. The gate dielectric layer 130 is made of, for example, dielectric materials, such as silicon dioxide, silicon nitride, silicon oxynitride, and so on. Next, another deposition process is carried out to form the semiconductor layer 140 on the gate dielectric layer 130. The semiconductor layer 140 is made of amorphous silicon (a-Si) or polysilicon, for example. Thereafter, still another deposition process is implemented to form a dielectric material layer (not shown) on the semiconductor layer 140. The dielectric material layer is made of an inorganic material, for example. Afterwards, an etching process is performed with use of a patterned photoresist as a mask, so as to pattern the dielectric material layer and to form the patterned dielectric layer 150A.

Note that the manufacturing conditions of the patterning process can be adjusted to determine the removal amount of the dielectric material layer. Further, a thickness d of the bumps 154A as well as an included angle α between sides of the bumps 154A and an upper surface of the substrate 110 can also be adjusted. In the present embodiment, the thickness d of the bumps 154A preferably ranges from 0.1 μm to 3 μm, while the included angle α is greater than 5° but less than 60°, preferably in a range of 10°~20° or within 15°.

Figure 2C:
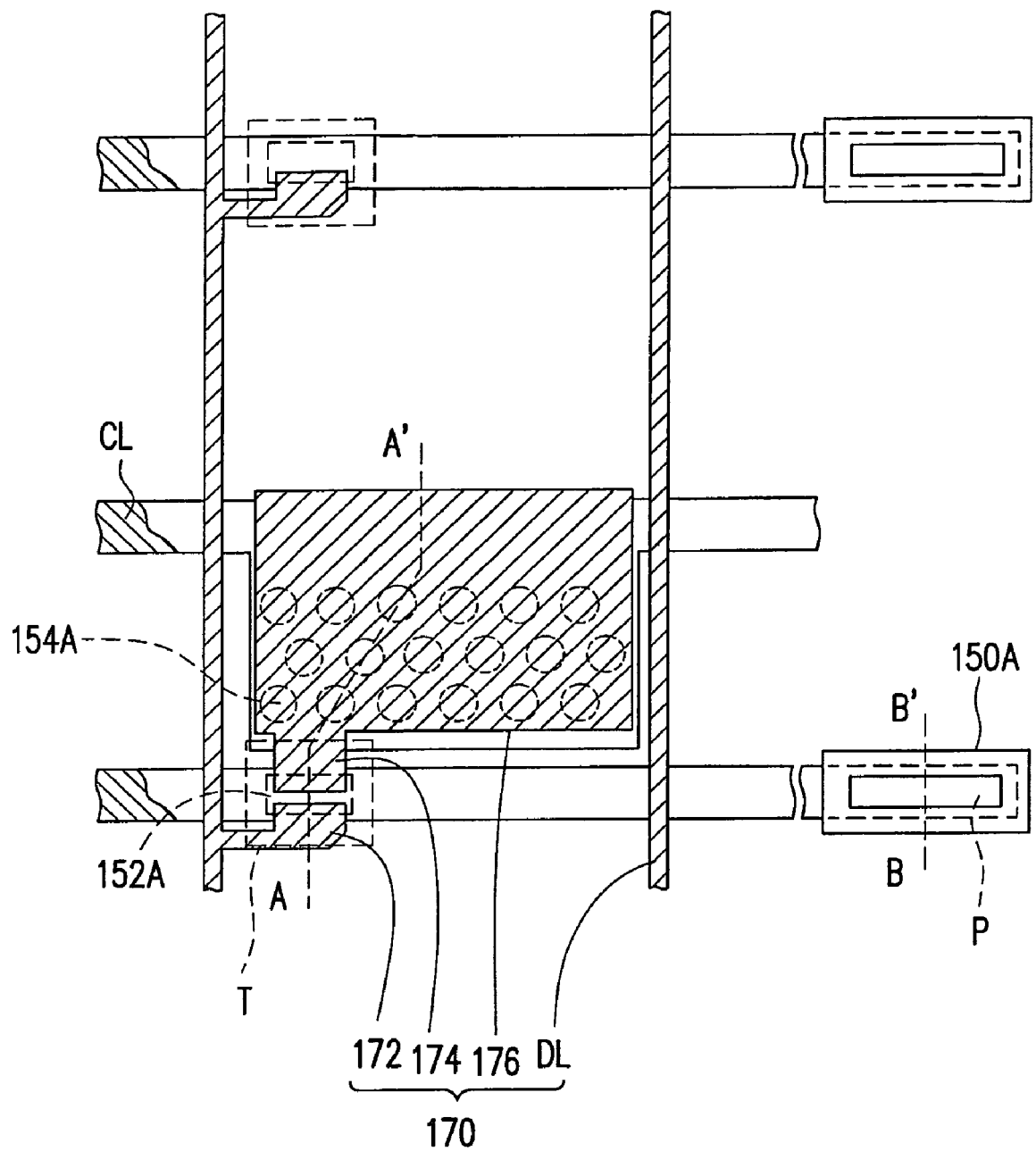

After that, referring to FIGS. 1C and 2C, a patterned metal layer 170 is formed over the substrate 110. Besides, the semiconductor layer 140 (illustrated in FIG. 1B) is patterned, so as to form a patterned semiconductor layer 140a. The patterned metal layer 170 includes a source 172, a drain 174 and a reflective pixel electrode 176 connected to the drain 174. The source 172 and the drain 174 respectively cover portions of the channel area 142. The reflective pixel electrode 176 covers and is conformal with the bumps 154A, so as to form an uneven surface and to cover a portion of the patterned semiconductor layer 140a disposed above the common electrode line CL. Here, the gate 120, the gate dielectric layer 130 located above the gate 120, the channel area 142, the source 172 and the drain 174 together form a transistor T. The common electrode line CL and the reflective pixel electrode 176 disposed thereabove together form a storage capacitor SC.

In detail, a method of forming the patterned metal layer 170 includes following steps. First, a metal layer (not shown) is formed on the substrate 110 by performing a sputtering process, so as to cover the etching-stop layer 152A and the bumps 154A. Next, an etching process is implemented to pattern the metal layer for forming the patterned metal layer 170. In the meantime, a portion of the etching-stop layer 152A is exposed. Furthermore, a data line DL connected to the source 172 can also be formed in the same step of forming the patterned metal layer 170.

Besides, prior to the formation of the metal layer, an ohmic contact material layer (not shown) can be further formed on the substrate 110 by performing a deposition process, so as to cover the etching-stop layer 152A and the bumps 154A. Here, the ohmic contact material layer is positioned between the metal layer and the semiconductor layer 140 (depicted in FIG. 1B) and between the metal layer and the patterned dielectric layer 150A.

On the other hand, after the formation of the patterned metal layer 170, another etching process can be further carried out with use of the patterned dielectric layer 150A and the patterned metal layer 170 as the mask, such that the semiconductor layer 140 (depicted in FIG. 1B) and the ohmic contact material layer are patterned, and that the patterned semiconductor layer 140a and an ohmic contact layer 160 are respectively formed. At this time, the ohmic contact layer 160 and the patterned metal layer 170 have identical patterns. In addition, the patterned metal layer 170 disposed above the gate 120 exposes a portion of the etching-stop layer 152A, while the patterned dielectric layer 150A disposed on the bonding pad P exposes a portion of the gate dielectric layer 130.

In the present embodiment, the material of an uppermost portion of the patterned metal layer 170 is, for example, silver (Ag), aluminum (Al), or other conductive materials having great reflectivity, so as to form the reflective pixel electrode 176 to reflect external light. Moreover, the coverage of the patterned metal layer 170 on the bumps 154A is conducive to increasing the reflectivity of the reflective pixel electrode 176.

In brief, a reflective area and the reflectivity of the reflective pixel electrode 176 can be increased by covering the reflective pixel electrode 176 on the bumps 154A according to the present embodiment. Moreover, in the present embodiment, the included angle α can be adjusted to the range of 5°~60° based on the manufacturing conditions. Thereby, the reflective pixel electrode 176 is characterized by outstanding reflectivity. By contrast, in other embodiments which are not illustrated in the drawings of the present invention, the included angle α preferably ranges from 10° to 20° or within 15°.

Figure 2D:
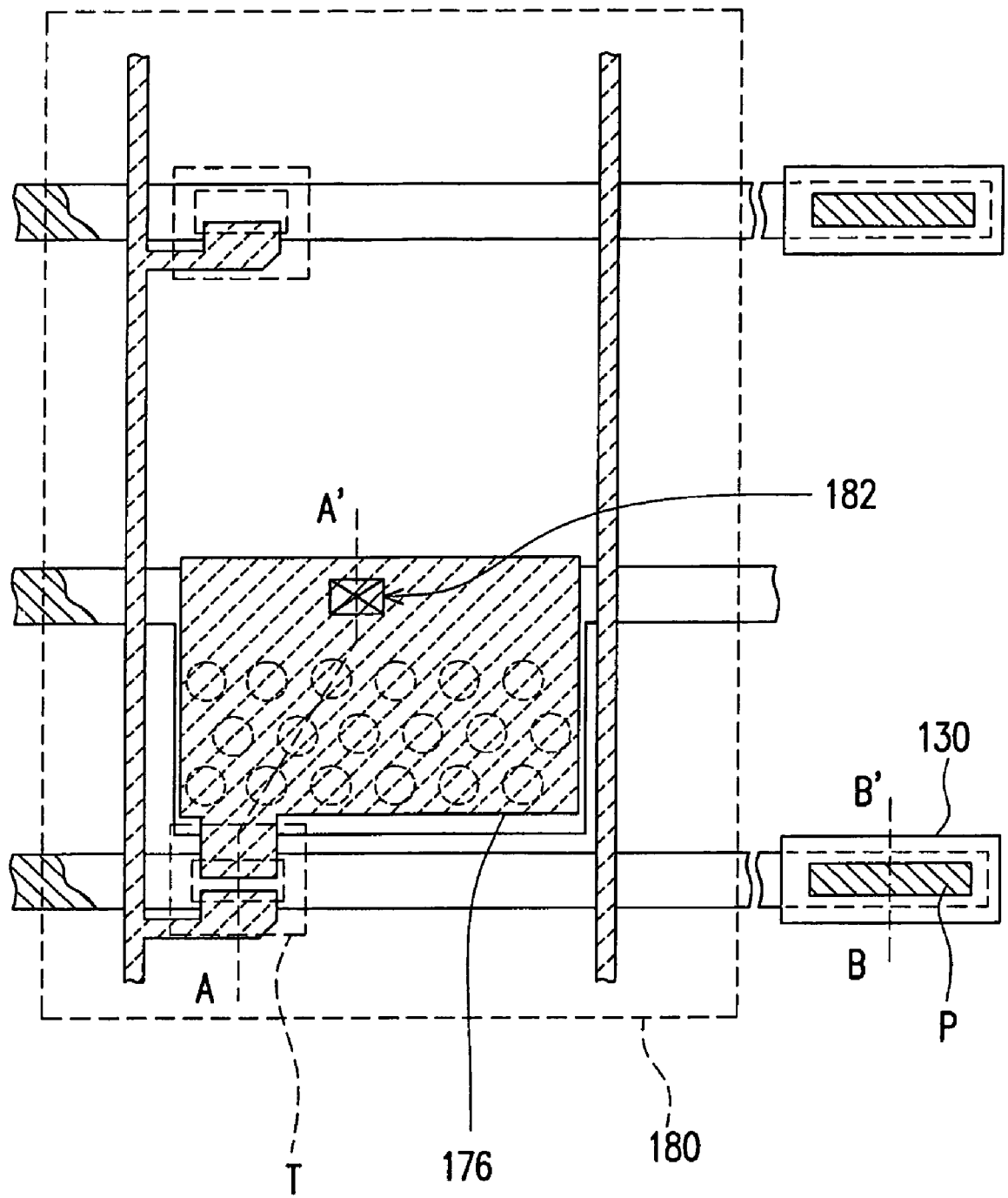

Next, referring to FIGS. 1D and 2D, after the patterned metal layer 170 is formed, an organic dielectric material (not shown) is coated onto the substrate 110, so as to form an overcoat dielectric layer 180 covering the transistor T and the reflective pixel electrode 176. The overcoat dielectric layer 180 is capable of protecting the transistor T to ensure its satisfactory electrical performance. Besides, the overcoat dielectric layer 180 exposes the patterned dielectric layer 150A (depicted in FIG. 1C) and the gate dielectric layer 130 disposed above the bonding pad P. In the present embodiment, the organic dielectric material is, for example, acrylic resin or a photoresist material. A dielectric constant of the overcoat dielectric layer 180 is, for example, in a range of 2~7, and a thickness of the overcoat dielectric layer 180 ranges from 0.1 μm to 6 μm, for example.

A lithography process or the etching process is then carried out for fabricating a contact opening 182 (or a contact hole) on the overcoat dielectric layer 180. The contact opening 182 exposes a portion of the reflective pixel electrode 176. Meanwhile, during the formation of the contact opening 182, the patterned dielectric layer 150A (illustrated in FIG. 1C) and the patterned semiconductor layer 140a (illustrated in FIG. 1C) disposed above the bonding pad P can be employed as the etching mask to remove the gate dielectric layer 130 exposed thereby, and a portion of the bonding pad P is further exposed.

Figure 2E:
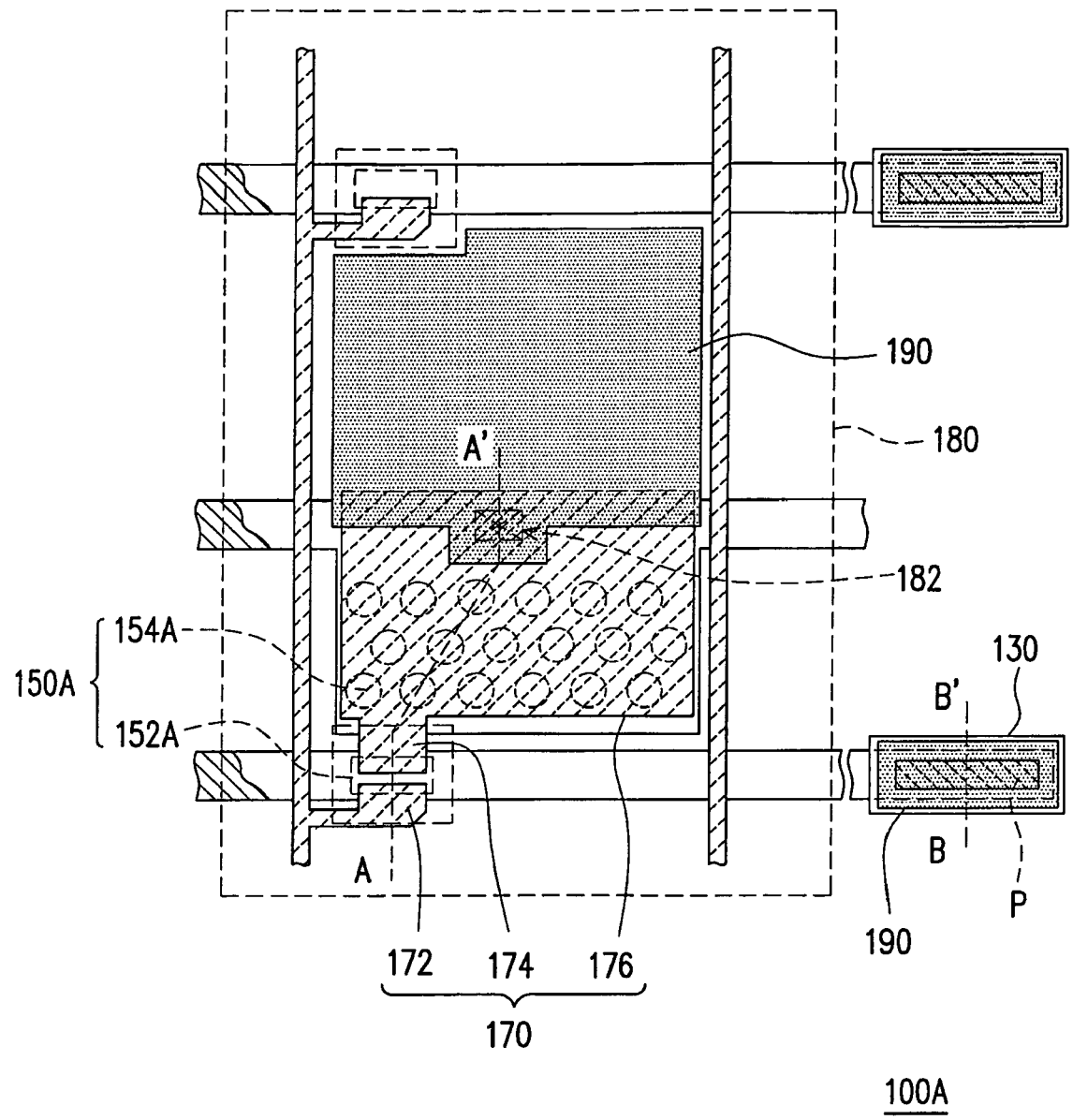

After that, referring to FIGS. 1E and 2E, a transparent pixel electrode 190 is formed on the overcoat dielectric layer 180. The transparent pixel electrode 190 is electrically connected to the reflective pixel electrode 176 through the contact opening 182. A method of forming the transparent pixel electrode 190 includes forming a transparent conductive material on the overcoat dielectric layer 180 and patterning the transparent conductive material, such that the transparent pixel electrode 190 is formed. The transparent conductive material includes indium tin oxide (ITO), indium zinc oxide (IZO), or other transparent conductive materials. Additionally, the patterned transparent conductive materials can further cover both a portion of the gate dielectric layer 130 and the bonding pad P. Here, the bonding pad P is exposed by the gate dielectric layer 130. After said processes are performed, the fabrication of a pixel structure 100A is approximately completed.

Here, the pixel structure 100A disposed on the substrate 110 includes the gate 120, the gate dielectric layer 130, the patterned semiconductor layer 140a, the patterned dielectric layer 150A, the patterned metal layer 170, the overcoat dielectric layer 180 and the transparent pixel electrode 190. The gate 120 is disposed on the substrate 110, while the gate dielectric layer 130 is disposed on the substrate 110 to cover the gate 120. The patterned semiconductor layer 140a is disposed on the gate dielectric layer 130 and has the channel area 142 located above the gate 120. The patterned dielectric layer 150A is disposed on the patterned semiconductor layer 140a and includes the etching-stop layer 152A disposed above the gate 120 and the plurality of bumps 154A.

In addition, the patterned metal layer 170 includes the source 172, the drain 174 and the reflective pixel electrode 176 connected to the drain 174. The source 172 and the drain 174 respectively cover portions of the channel area 142. The reflective pixel electrode 176 covers the bumps 154A, such that the reflective pixel electrode 176 is conformal with the bumps 154A. The gate 120, the gate dielectric layer 130, the patterned semiconductor layer 140a, the source 172, and the drain 174 together form the transistor T. The overcoat dielectric layer 180 is disposed on the transistor T and includes the contact opening 182 to expose a portion of the reflective pixel electrode 176. The transparent pixel electrode 190 is disposed on the overcoat dielectric layer 180 and is electrically connected to the reflective pixel electrode 176 through the contact opening 182.

As shown in FIG. 1E, the pixel structure 100A has the reflective pixel electrode 176 capable of reflecting the light and the transparent pixel electrode 190 capable of permitting the light to penetrate, and said two pixel electrodes 176 and 190 are electrically connected to each other through the contact opening 182. Therefore, the pixel structure 100A is the transflective pixel structure.

In the pixel structure 100A, the overcoat dielectric layer 180 poses an impact on an electrical field above the reflective pixel electrode 176, such that the electrical field above the reflective pixel electrode 176 and that above the transparent pixel electrode 190 are different. Accordingly, as the pixel structure 100A is applied to LCDs (not shown), similar display effect can be achieved both in a reflective display area where the reflective pixel electrode 176 is located and in a transmissive display area where the transparent pixel electrode 190 is positioned through adjusting the thickness of the overcoat dielectric layer 180. In other words, display images are not apt to be unbalanced between the transmissive display area and the reflective display area when the pixel structure 100A is applied to the TR-LCD.

Currently, most of the TR-LCDs adopt the padding layers to form dual cell gap, such that the frame display between the transmissive display area and the reflective display area can be uniform. On the contrary, according to the present invention, the pixel structure 100A with single cell gap is able to balance the frame display between the transmissive display area and the reflective display area by adjusting the thickness or the material (the dielectric constant) of the overcoat dielectric layer 180. As such, the manufacturing process of the pixel structure 100A is rather simple, and the manufacturing costs thereof are relatively low.

Particularly, in the conventional TR-LCDs having dual cell gap, an arrangement of liquid crystal molecules are not apt to be managed at an edge of the padding layer, resulting in light leakage and further impairing the display quality of the TR-LCD. By contrast, the pixel structure 100A of the present embodiment has single cell gap, and thus the light leakage does not easily occur.

Figure 3:
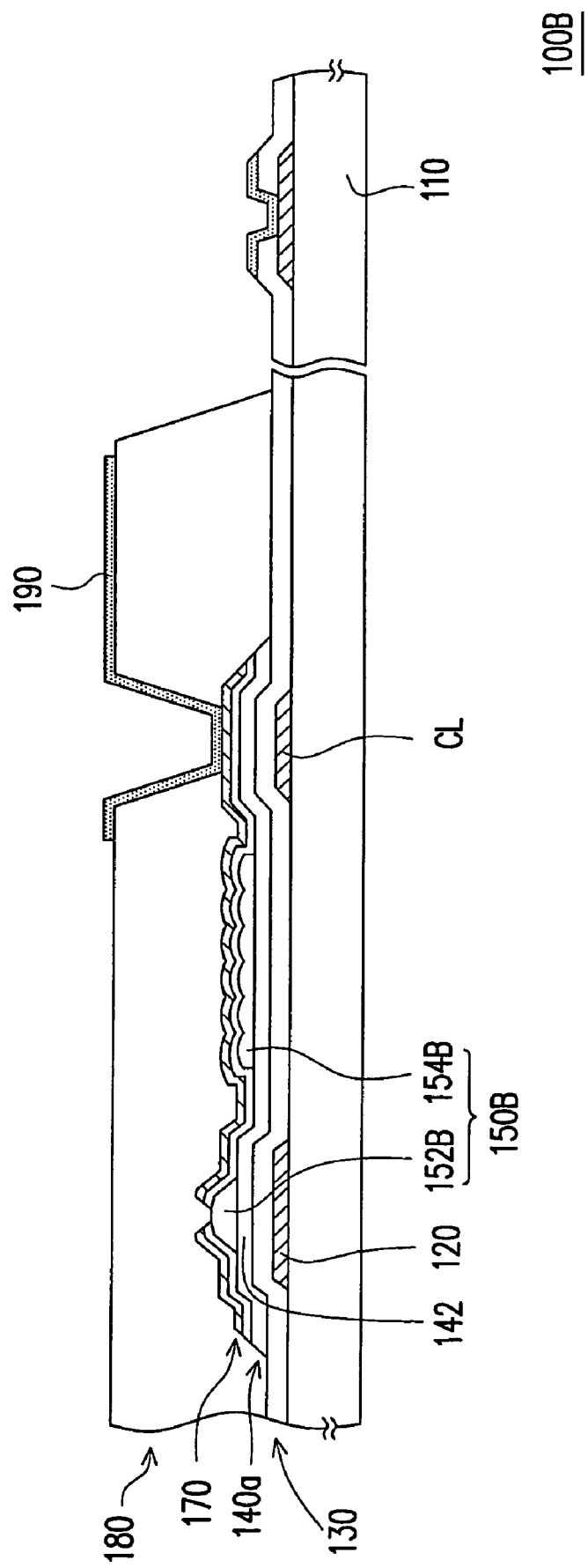
FIG. 3 is a cross-sectional view of a pixel structure according to another embodiment of the present invention.

FIG. 3 is a cross-sectional view of a pixel structure according to another embodiment of the present invention. Referring to FIG. 3, a pixel structure 100B in the present embodiment is similar to the pixel structure 100A indicated in FIG. E. The difference therebetween lies in that the patterned dielectric layer 150A of the pixel structure 100A is made of the inorganic material, while a patterned dielectric layer 150B of the pixel structure 100B is made of an organic material. Moreover, the shape of the patterned dielectric layer 150B and the position where bumps 154B are formed are different from the patterned dielectric layer 150A.

A manufacturing method of the pixel structure 100B is briefed as follows. First, the substrate 110 is provided, and the gate 120 is formed thereon. Next, the gate dielectric layer 130 and the semiconductor layer (not shown) are sequentially formed on the substrate 110. In the present embodiment, the gate 120, the gate dielectric layer 130, and the semiconductor layer are formed in the same manner with the same materials as described in the previous embodiment, and thus no further explanation is provided herein.

Thereafter, an organic dielectric material (not shown) is coated onto the substrate 110, so as to form a dielectric material layer (not shown) covering the semiconductor layer. A lithography process is then carried out for patterning the dielectric material layer and forming the patterned dielectric layer 150B. The patterned dielectric layer 150B includes an etching-stop layer 152B disposed above the channel area 142 and a plurality of bumps 154B. Here, it is possible for the bumps 154B not to be formed above the common electrode line CL.

It should be noted that a reflowing process can be performed on the patterned dielectric layer 150B after the patterned dielectric layer 150B is formed, such that upper surfaces of the etching-stop layer 152B and the bumps 154B are in a melted state. After the patterned dielectric layer 150B is cooled down, the etching-stop layer 152B and the bumps 154B have arc-shaped protrusions as shown in FIG. 3.

Likewise, the manufacturing conditions of the patterning process can be adjusted in the present embodiment to determine the removal amount of the dielectric material layer. Further, a thickness d of the bumps 154B can also be adjusted. In the present embodiment, the thickness d of the bumps 154B preferably ranges from 0.1 µm to 3 µm.

After that, the patterned semiconductor layer 140a, the patterned metal layer 170, the overcoat dielectric layer 180, and the transparent pixel electrode 190 are formed on the substrate 110, and the fabrication of the pixel structure 100B of the present invention is approximately finished. According to the present embodiment, the materials and the manufacturing methods of the patterned semiconductor layer 140a, the patterned metal layer 170, the overcoat dielectric layer 180, and the transparent pixel electrode 190 are similar to those provided in the previous embodiment, and thus further descriptions are omitted.

In summary, the pixel structure and the manufacturing method thereof in the present invention have at least the following advantages:

In the pixel structure of the present invention, the bumps are fabricated by film layers originally disposed in the transistor, and thus no additional manufacturing process is required in the fabrication of the bumps.

In the pixel structure of the present invention, the thickness and the profile of the bumps can be adjusted through changing the process conditions. Thereby, the reflectivity of the reflective pixel electrode covering the bumps can be effectively promoted.

The pixel structure of the present invention has single cell gap, and thus the light leakage is not apt to occur.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a pixel structure, comprising:

providing a substrate;

forming a gate on the substrate;

forming a gate dielectric layer on the substrate, the gate dielectric layer covering the gate;

forming a semiconductor layer on the gate dielectric layer, the semiconductor layer comprising a channel area located above the gate;

forming a patterned dielectric layer on the semiconductor layer, the patterned dielectric layer comprising an etching-stop layer disposed above the gate and a plurality of bumps;

forming a patterned metal layer over the substrate, the pattern metal layer comprising a source, a drain and a reflective pixel electrode connected to the drain, wherein the source and the drain respectively cover portions of the channel area and the reflective pixel electrode covers the bumps to form an uneven surface;

patterning the semiconductor layer with use of the patterned metal layer as a mask, so as to form a patterned semiconductor layer, wherein the gate, the gate dielectric layer, the patterned semiconductor layer, the source and the drain together form a transistor;

forming an overcoat dielectric layer on the transistor;

forming a contact opening on the overcoat dielectric layer to expose a portion of the reflective pixel electrode; and forming a transparent pixel electrode on the overcoat dielectric layer, the transparent pixel electrode being electrically connected to the reflective pixel electrode through the contact opening.

2. The manufacturing method of the pixel structure as claimed in claim 1, further comprising forming an ohmic contact layer sandwiched between the patterned metal layer and the patterned semiconductor layer and between the patterned metal layer and the patterned dielectric layer.

3. The manufacturing method of the pixel structure as claimed in claim 2, wherein the ohmic contact layer and the patterned metal layer are simultaneously patterned.

4. The manufacturing method of the pixel structure as claimed in claim 1, wherein a dielectric constant of the overcoat dielectric layer approximately ranges from 2 to 7.

5. The manufacturing method of the pixel structure as claimed in claim 1, wherein a thickness of the overcoat dielectric layer approximately ranges from 0.1 µm to 6 µm.

6. The manufacturing method of the pixel structure as claimed in claim 1, wherein a thickness of the bumps approximately ranges from 0.1 µm to 3 µm.

7. The manufacturing method of the pixel structure as claimed in claim 1, further comprising forming a common electrode line on the substrate during the formation of the gate, wherein the common electrode line and a portion of the reflective pixel electrode disposed above the common electrode line together form a storage capacitor.

* * * * *